US005324887A

United States Patent [19]

Catt et al.

[11] Patent Number: 5,324,887

[45] Date of Patent: Jun. 28, 1994

[54] SCREEN PRINTED OF MASK PRINTED MICROWAVE ABSORBING MATERIAL ON MODULE LIDS TO SUPPRESS EMI

[75] Inventors: Martin L. Catt, Richardson; Gray E. Fowler, McKinney; Donald L. Purinton, Plano; Leon Stiborek, Dallas, all of Tex.

[73] Assignee: Texas Instruments Incorporated, Dallas, Tex.

[21] Appl. No.: 904,427

[22] Filed: Jun. 26, 1992

[51] Int. Cl.[5] .................. H05K 9/00

[52] U.S. Cl. .................. 174/35 R; 174/35 GC; 174/35 MS; 219/744

[58] Field of Search .................. 219/10.55 D, 10.55 M, 219/10.55 E; 174/35 GC, 35 R, 35 MS; 220/DIG. 30

[56] References Cited

U.S. PATENT DOCUMENTS

| | | | |
|---|---|---|---|
| 3,555,168 | 1/1971 | Frykberg | 174/35.2 |
| 4,066,837 | 1/1978 | Miura | 174/35 GC |
| 4,288,081 | 9/1981 | Sado | 174/35 GC |
| 4,670,347 | 6/1987 | Lasik et al. | 174/35 R |
| 4,690,778 | 9/1987 | Narumiya et al. | 252/506 |
| 4,785,148 | 11/1988 | Mayer | 219/10.55 D |
| 4,858,074 | 8/1989 | Mallet et al. | 361/338 |
| 4,970,358 | 11/1990 | Brandberg et al. | 219/10.55 E |

*Primary Examiner*—Bruce A. Reynolds
*Assistant Examiner*—Tuan Vinh To
*Attorney, Agent, or Firm*—René E. Grossman; Richard L. Donaldson

[57] ABSTRACT

An absorber for a microwave module and method of fabrication thereof wherein an ink is provided from a mixture of powdered iron and a resin. The ink is then screen printed or mask printed onto the interior surface of the lid of the microwave module in a predetermined pattern to lower the Q of the cavities within the module. The lowered Q suppresses the electromagnetic resonance and thereby minimizes the EMI problems. Furthermore, the absorber material reduces EMI between sections of the module at frequencies where no cavity resonances occur.

9 Claims, 1 Drawing Sheet

SCREEN PRINTED OF MASK PRINTED MICROWAVE ABSORBING MATERIAL ON MODULE LIDS TO SUPPRESS EMI

BACKGROUND OF THE INVENTION

1. Field of the Invention

This invention relates to microwave modules and, more specifically, to a method and material for use in conjunction with the lids of microwave modules to lower the Q of the cavities within the module to suppress electromagnetic resonance therein and reduce electromagnetic crosstalk between sections of the module, even for frequencies where there is an absence of resonance.

2. Brief Description of the Prior Art

In microwave circuitry, it is known that there can be electromagnetic resonance within the cavities of the microwave module containing the circuitry therein. This resonance causes undesirable EMI problems. It is also known that these EMI problems can be minimized by lowering the Q of the cavities within the module. The lowered Q suppresses the electromagnetic resonance and thereby minimizes the EMI problems. Even for frequencies where there is an absence of resonance, EMI crosstalk between different areas of the module can be reduced by the presence of microwave absorbing material.

In the prior art, EMI within the module has been reduced by producing a sheet of absorber material, such as, for example elastomer filled with iron powder, cutting out a pattern from the sheet of absorber material to fit around the components within the module, this pattern generally being very complex in shape, and then bonding the absorber to the module lid with an adhesive. The positioning of the absorber material on the lid has to be precise and of sufficient accuracy so that the pattern is positioned to fit around walls and components within the module without interference with components and module case features. This prior art procedure has provided the desirable result of EMI reduction, but only at great relative expense due to the precision shaping and positioning required of the sheet of absorber material.

SUMMARY OF THE INVENTION

In accordance with the present invention, EMI in microwave modules is reduced in a much more economical and cost-effective manner.

Briefly, an ink is provided using a resin, such as, for example, silicone, epoxy or urethane filled with iron or ferrite particles, such as, for example, iron spheres made from carbonyl iron. The preferred filler is GAF iron Grade E with average particle diameter of 4 to 6 microns. This ink is then precision screen printed or mask printed onto the lids of the microwave modules and cured to provide polymerization and adhesion to the module lid. The cured compound lowers the EMI within the microwave module due to both resonant and non-resonant coupling phenomena.

The ink required for screen or mask printing must have a microwave absorber material, such as carbon, iron or ferrite, preferably iron powder made from carbonyl iron. The ink desirably includes a resin with the absorber material dispersed therethrough, preferably homogeneously. Resins that can be used are, for example, epoxies, silicones, urethanes, cyanate esters, polyesters, polyimides and other thermoset resins.

The ink is produced by mixing together the resin forming materials in proper proportion and under required conditions to partially form the final resin. Then the absorber particles are added and distributed throughout the resin by mixing processes. Any remaining absorber particles and any further materials required to complete formation of the final resin are now added and the materials are mixed to form the final ink product of resin and absorber particles. During this process of compounding the ink, various substances may be added, such as surfactants, coupling agents, wetting agents, solvents, thixotropic agents, small fibers, etc.

The ink is coated onto the lid of a microwave module by providing the required standard mask or screen for printing, lining up the mask or screen accurately on the lid and then providing the printing step with the ink to provide a coating of ink on the lid surface with the desired pattern. The ink is then permitted to harden by curing, drying or a combination thereof to provide the required end product. The steps of printing and curing can be repeated to provide an absorber layer of desired thickness.

DESCRIPTION OF THE PREFERRED EMBODIMENT

Figure 1:
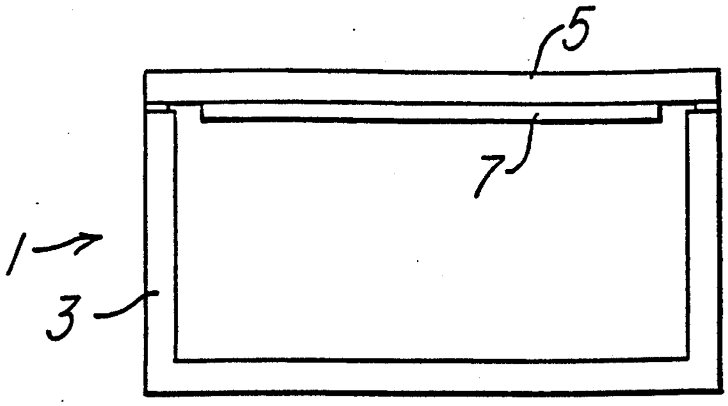
FIG. 1 is a cross-section of a microwave module in accordance with the present invention.

Referring first to FIG. 1, there is shown a microwave module 1 which includes a housing 3 and a lid 5. An absorber 7 is secured to the underside of the lid as will be explained hereinbelow.

Figure 2:
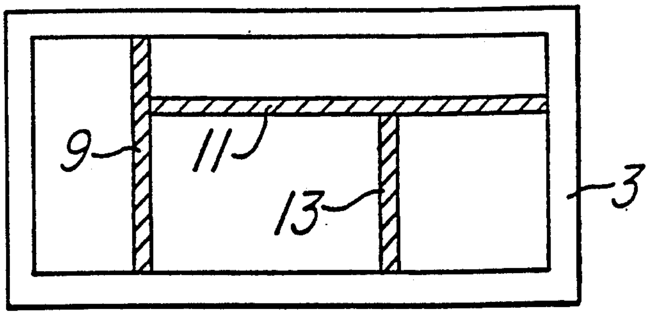
FIG. 2 is a top view of the microwave module of FIG. 1 with the top removed.
Figure 3:
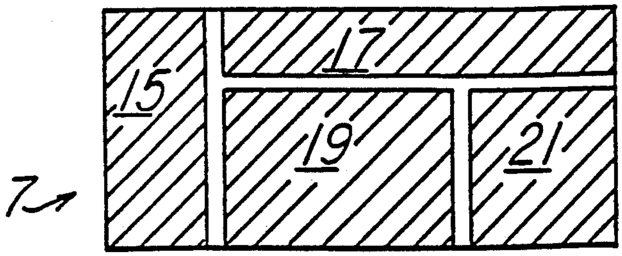
FIG. 3 is the absorber of FIG. 2.

Referring now to FIG. 2, there is shown a very simplified top view of the housing 3 with the lid 5 removed. The housing 3 contains wall sections 9, 11 and 13 some or all of which can extend upwardly to the top of the housing. In addition, components (not shown) are disposed in the housing 3, some of which can extend upwardly to the top of the housing. The absorber 7 is patterned to extend downwardly from the lid 5 and fit around any wall sections 9, 11 and 13 or any components which extend to the top of the housing 3 and into the housing. Since only wall sections 9, 11 and 13 are shown in FIG. 2 and it is assumed that these wall sections all extend to the top of the housing 3, the absorber of FIG. 3 has been patterned in the shape of the wall sections wherein absorber material is disposed at regions 15, 17, 19 and 21 but not in the unshaded portions. The absorber material at regions 15, 17, 19 and 21 extends into the housing 3 whereas the regions therebetween are essentially without thickness.

The absorber 7 is fabricated by first forming an ink for use in conjunction with standard screen printing or mask printing technology. The preferred ink is provided by combining a low viscosity, cycloaliphatic epoxy resin (Ciba-Geigy CY-179) with a low viscosity, high temperature curing agent, an aromatic liquid anhydride (Ciba-Geigy HY-906). To help accelerate the cure, a tertiary amine catalyst is added (Pacific Anchor K-54). The ratios by weight are as follows:

CY-179 . . . 25.0

HY-906 . . . 7.0

K-54 . . . 3.0

These above ratios provide a 100% solids, stoichiometric blend. Carbonyl iron powder is then added to the above blend under high speed (1700 RPM), high shear mixing in the following rations by weight:

Liquid resins . . . 55.0

Iron powder . . . 300.0

Fumed silica (Cabot Cab-O-Sil M-5 or TS-720) can also be added at this point to customize the flow characteristics. Typical amounts would be about 0.25% of the total blend by weight. The shelf life of the above described ink is about 10 hours at normal room temperature.

The best printing results have been obtained by using a 60 mesh screen filled with a patterned emulsion coating. Sharp pattern edge definition is provided when two layers of Ulane CDF5VT direct film photo emulsion are used to fill the screen, the emulsion is exposed and the desired pattern is left in the screen when the exposed emulsion is washed out of the screen with water.

To print a pattern on a substrate, a line of ink is poured on the screen and drawn across the patterned area with a squeegee. The substrate on which the ink is to be placed should be cleaned prior to printing thereon with a methylethylketone (MEK)-soaked pad. Each print with a 70-mesh screen deposits about 0.003 to about 0.004 inches of material. For thicker deposits, successive prints must be made, curing the ink between each print. Depending upon various factors, such as substrate mass, the ink can be snap-cured by placing the printed substrate on an aluminum plate preheated inside a 300° F. oven for about 5 to about 10 minutes. Once the final desired thickness has been obtained, the ink is post cured for about 4 hours at about 300° F.

Though the invention has been described with respect to a specific preferred embodiment thereof, many variations and modifications will immediately become apparent to those skilled in the art. For example, an iron filled silicone resin has been used with a 0.018 inch thick metal mask or stencil to print the absorber material on a module lid with one squeegee pass. It is therefore the intention that the appended claims be interpreted as broadly as possible in view of the prior art to include all such variations and modifications, such as, for example, stencil and mask printing.

We claim:

1. A microwave module which comprises:

(a) a housing, (b) a lid for said housing having an interior surface, and (c) a patterned ink comprising a microwave absorber material taken from a class consisting of carbon or iron-containing particles disposed on the interior surface of said lid.

2. The module of claim 1 wherein said patterned ink is patterned by one of screen printing or mask printing.

3. The module of claim 2 wherein said ink contains a mixture of a material taken from a class consisting of powdered iron and ferrites and resin.

4. The module of claim 3 wherein said resin is a thermosetting resin.

5. The module of claim 4 wherein said thermosetting resin is one of an epoxy resin or a silicone resin.

6. The module of claim 1 wherein said ink contains a mixture of a material taken from a class consisting of powdered iron and ferrites and a resin.

7. The module of claim 6 wherein said resin is a thermosetting resin.

8. The module of claim 7 wherein said thermosetting resin is one of an epoxy resin or a silicone resin.

9. The module of claim 1 wherein said microwave absorber material comprises iron containing particles, said iron-containing particles being made from carbonyl iron.

* * * * *